(12) United States Patent
Kondo et al.

(10) Patent No.: US 10,910,136 B2
(45) Date of Patent: ***Feb. 2, 2021

(54) SEMICONDUCTOR DEVICE, IN-VEHICLE VALVE SYSTEM AND SOLENOID DRIVER

(71) Applicant: Renesas Electronics Corporation, Tokyo (JP)

(72) Inventors: Satoshi Kondo, Tokyo (JP); Kazuaki Kubo, Tokyo (JP); Noriyuki Itano, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 64 days.

This patent is subject to a terminal disclaimer.

(21) Appl. No.: 16/185,194

(22) Filed: Nov. 9, 2018

(65) Prior Publication Data

US 2019/0080830 A1    Mar. 14, 2019

Related U.S. Application Data

(63) Continuation of application No. 15/071,034, filed on Mar. 15, 2016, now Pat. No. 10,176,913.

(30) Foreign Application Priority Data

Apr. 9, 2015  (JP) ................. 2015-079727

(51) Int. Cl.
*H01F 7/06* (2006.01)
*H01F 7/18* (2006.01)
*H03F 3/45* (2006.01)

(52) U.S. Cl.
CPC ........... *H01F 7/064* (2013.01); *H01F 7/1844* (2013.01); *H03F 3/45475* (2013.01);
(Continued)

(58) Field of Classification Search
CPC .................. H01F 7/064; H01F 7/1844; H01F 2007/1866; H01F 2007/1888;
(Continued)

(56) References Cited

U.S. PATENT DOCUMENTS 5,930,103 A    7/1999  Heck
6,275,368 B1   8/2001  Yamada et al.
(Continued)

FOREIGN PATENT DOCUMENTS

EP    0 944 100 A1    9/1999
JP    2000-112541 A   7/1992
(Continued)

OTHER PUBLICATIONS

Notice of Allowance in U.S. Appl. No. 15/071,034 dated Aug. 9, 2018.
(Continued)

*Primary Examiner* — Dharti H Patel
(74) *Attorney, Agent, or Firm* — McGinn IP Law Group, PLLC

(57) ABSTRACT

A semiconductor device includes an output driving circuit configured to output an output current to an output terminal; a detection resistor connected between the output terminal and the output driving circuit; an amplification unit configured to output an analog detection signal generated by amplifying a voltage between both ends of the detection resistor; a current generation circuit configured to output a reference current; a reference resistor connected between the current generation circuit and a ground and configured to output a reference voltage according to the reference current; an A/D converter configured to convert the analog detection signal into a digital detection signal using the reference voltage as a reference; and a control circuit configured to control the output current output from the output (Continued)

driving circuit according to the digital detection signal. The detection resistor has a same temperature characteristics as the reference resistor.

3 Claims, 17 Drawing Sheets

(52) U.S. Cl.
CPC ............... *H01F 2007/1866* (2013.01); *H01F 2007/1888* (2013.01); *H03F 2203/45588* (2013.01); *H03F 2203/45594* (2013.01); *H03F 2203/45616* (2013.01)

(58) Field of Classification Search
CPC ............... H01F 7/1805; H03F 3/45475; H03F 2203/45588; H03F 2203/45594; H03F 2203/45616; F16K 31/0675; G05F 1/567; F02D 41/20; G01R 1/203; G01R 19/25; H01H 47/325; H03K 17/145; H03K 17/6871
USPC .................................................. 361/93.1–93.9
See application file for complete search history.

(56) References Cited

U.S. PATENT DOCUMENTS

| | | | |
|---|---|---|---|
| 10,176,913 B2* | 1/2019 | Kondo | H01F 7/1844 |
| 2005/0264272 A1 | 12/2005 | Novak | |
| 2008/0238391 A1* | 10/2008 | Williams | H01F 7/1844 |
| | | | 323/283 |
| 2009/0324449 A1* | 12/2009 | Kira | G01N 27/16 |
| | | | 422/96 |
| 2010/0085025 A1* | 4/2010 | Kato | H02M 3/157 |
| | | | 323/282 |
| 2010/0301932 A1 | 12/2010 | Byon | |
| 2011/0101959 A1 | 5/2011 | Hirotsu et al. | |
| 2013/0278059 A1* | 10/2013 | Liu | G01R 19/10 |
| | | | 307/31 |
| 2014/0111215 A1* | 4/2014 | Inukai | G01R 19/257 |
| | | | 324/431 |
| 2016/0291089 A1 | 10/2016 | Arumugam | |

FOREIGN PATENT DOCUMENTS

| | | |
|---|---|---|
| JP | H04-186762 A | 7/1992 |
| JP | 2005-019617 A | 1/2005 |
| JP | 2006-100509 A | 4/2006 |
| JP | 2010-093339 A | 4/2010 |
| JP | 2011-097434 A | 5/2011 |

OTHER PUBLICATIONS

Supplemental Notice of Allowance in U.S. Appl. No. 15/071,034 dated Oct. 4, 2018.
Japanese Office Action, dated Aug. 7, 2018, in Japanese Application No. 2015-079727 and Partial English Translation thereof.
Extended European Search Report dated Aug. 25, 2016.
Ken Yang: "Advanced Current Sensing Suits High-Rel Systems High-Side Current-Sense Amplifiers" Aug. 31, 2005, pp. 40-45, XP055295536.
Anonymous: "Accurate High-Side Current-Sense Amplifier Monitors PWM Load Current—Application Note—Maxim" Jun. 27, 2011, pp. 1-7, XP055294956.
Chinese Office Action dated Oct. 22, 2018 in Chinese Application No. 201610217188.4 with an English translation.
"Advanced Current Sensing Suits High-Rel Systems", Ken Yang, PowerElectronics, pp. 40-45, Aug. 31, 2005 (https://www.powerelectronics.com/print/9186, pp. 1/7-7/7) (Retrieved Oct. 12, 2018).
Japanese Office Action, dated Mar. 26, 2019, in Japanese Application No. 2015-079727 and English Translation thereof.
European Office Action, dated Apr. 7, 2020, in European Application No. 16 164 482.8-1203.
Applicant's letter accompanying the claims after receipt of the European search report dated Dec. 4, 2017.

* cited by examiner

SEMICONDUCTOR DEVICE, IN-VEHICLE VALVE SYSTEM AND SOLENOID DRIVER

CROSS-REFERENCE TO RELATED APPLICATIONS

The present application is a Continuation Application of U.S. patent application Ser. No. 15/071,034, filed on Mar. 15, 2016, which is based on Japanese Patent Application No. 2015-079727 filed on Apr. 9, 2015, the contents of which is incorporated herein by reference in its entirety.

BACKGROUND

The present invention relates to a semiconductor device, an in-vehicle valve system and a solenoid driver, and relates to, for example, a semiconductor device, an in-vehicle valve system and a solenoid driver that control a solenoid valve mounted on a vehicle such as a car.

In general, opening/closing of a solenoid valve is controlled by supplying the solenoid with a current or cutting off the current. Therefore, it is required to precisely detect a current input to the solenoid to appropriately control the solenoid valve. Thus, a current control semiconductor device detecting the current input to the solenoid is introduced (Japanese unexamined patent publication No. 2011-97434).

SUMMARY

A semiconductor device for a car is used in an environment where temperature widely varies. Since the semiconductor device has temperature characteristics, it is difficult to precisely detect a current output to a solenoid. Therefore, there may be a case that the current output to the solenoid cannot be corrected to a desired value. In this case, variability of the shift-change in a vehicle is caused due to the temperature variation. Therefore, cases of increasing in shock of the shift-change or deteriorating ride quality are caused.

Other objects and new features will become apparent from the description of the present specification and the accompanying drawings.

According to an embodiment, there is provided a semiconductor devise that includes: an output driving circuit configured to output an output current to a solenoid incorporated in a vehicle through an output terminal; a detection resistor connected between the output terminal and the output driving circuit; an amplification unit configured to output an analog detection signal generated by amplifying a voltage between both ends of the detection resistor; a current generation circuit configured to output a reference current; a reference resistor connected between the current generation circuit and a ground and configured to output a reference voltage according to the reference current; an A/D converter configured to convert the analog detection signal into a digital detection signal using the reference voltage as a reference; and a control circuit configured to control the output current output from the output driving circuit according to the digital detection signal.

According to an embodiment, there is provided an in-vehicle valve system that includes: a solenoid valve including a solenoid and mounted on a vehicle; and a solenoid driver configured to control the solenoid. The solenoid driver includes: a semiconductor device configured to supply the solenoid with power; and a microcomputer configured to control the semiconductor device. The semiconductor device includes: an output driving circuit configured to output an output current to the solenoid through an output terminal; a detection resistor connected between the output terminal and the output driving circuit; an amplification unit configured to output an analog detection signal generated by amplifying a voltage between both ends of the detection resistor; a current generation circuit configured to output a reference current; a reference resistor connected between the current generation circuit and a ground and configured to output a reference voltage according to the reference current; an A/D converter configured to convert the analog detection signal into a digital detection signal using the reference voltage as a reference; and a control circuit configured to control the output current output from the output driving circuit according to the digital detection signal.

According to an embodiment, there is provided a solenoid driver that includes: a semiconductor device configured to supply a solenoid of a solenoid valve mounted on a vehicle with a current; and a microcomputer configured to control the semiconductor device. The semiconductor device includes: an output driving circuit configured to output an output current to the solenoid through an output terminal; a detection resistor connected between the output terminal and the output driving circuit; an amplification unit configured to output an analog detection signal generated by amplifying a voltage between both ends of the detection resistor; a current generation circuit configured to output a reference current; a reference resistor connected between the current generation circuit and a ground and configured to output a reference voltage according to the reference current; an A/D converter configured to convert the analog detection signal into a digital detection signal using the reference voltage as a reference; and a control circuit configured to control the output current output from the output driving circuit according to the digital detection signal.

According to an embodiment, it is possible to supply a solenoid mounted on a vehicle with a current without being affected by temperature variation

BRIEF DESCRIPTION OF THE DRAWINGS

The above and other aspects, advantages and features will be more apparent from the following description of certain embodiments taken in conjunction with the accompanying drawings, in which:

FIG. 5 is a circuit diagram illustrating a current flow in the output driving circuit of the semiconductor device according to the first embodiment when the HSD (high-side driver) is turned off and the LSD (low-side driver) is turned on;

DETAILED DESCRIPTION

Figure 1:
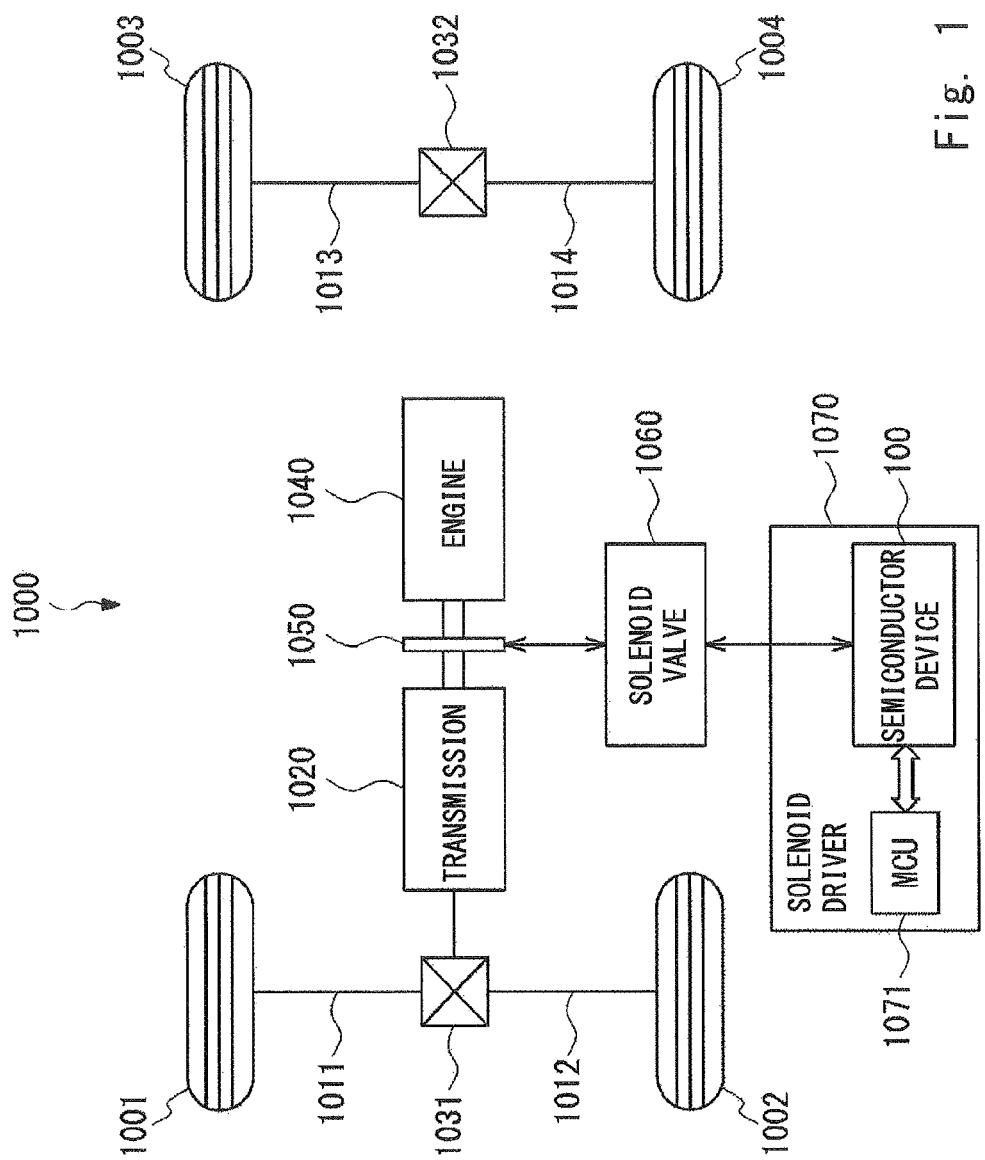
FIG. 1 is a diagram schematically illustrating an example of a drive-train of a vehicle incorporating a semiconductor device according to a first embodiment.

Hereinafter, embodiments of the present invention will be described with reference to the drawings. In the respective diagrams, the same constituent elements are denoted by the same reference numerals, and redundant description thereof will not be provided as necessary.

First Embodiment

A semiconductor device 100 according to a first embodiment will be described. Here, an example of an aspect of using the semiconductor device 100 will be firstly described. The semiconductor device 100 is configured as an electric circuitry mounted on a silicon substrate and a compound semiconductor substrate, and is incorporated in a solenoid driver that drives a solenoid valve mounted on a vehicle, for example. The solenoid driver is incorporated in an in-vehicle IC mounted on a vehicle, for example.

FIG. 1 is a diagram schematically illustrating an example of a drive-train of a vehicle incorporating the semiconductor device 100 according to the first embodiment. A vehicle drive-train 1000 includes drive wheels 1001 and 1002, wheels 1003 and 1004, shafts 1011 to 1014, a transmission 1020, differential gears 1031 and 1032, an engine 1040, a clutch 1050, a solenoid valve 1060, and a solenoid driver 1070. The solenoid driver 1070 is configured to enable to be incorporated in an electric control unit (ECU), for example.

Various types of engines generating driving power can be used as the engine 1040. The driving power generated by the engine 1040 is transmitted to the transmission 1020 through the clutch 1050. The transmission 1020 transmits the driving power to the drive wheel 1001 through the differential gear 1031 and the shaft 1011 and to the drive wheel 1002 through the differential gear 1031 and the shaft 1012. The wheel 1003 is interlocked through the shaft 1013. The wheel 1004 is interlocked through the shaft 1014.

An ECU 1070 is a device for controlling the engine 1040 and the solenoid valve 1060. The ECU 1070 includes the semiconductor device 100 functioning as a solenoid driver IC and a microcomputer (MCU) 1071 controlling the semiconductor device 100. The semiconductor device 100 controls opening/closing of the solenoid valve 1060 by controlling a current supplied to the solenoid valve 1060. In this example, a position of the clutch 1050 can be varied by opening/closing the solenoid valve 1060. That is, the semiconductor device 100 can control the transmission of the driving power from the engine 1040 to the transmission 1020 by controlling the opening/closing of the solenoid valve 1060.

Figure 2:
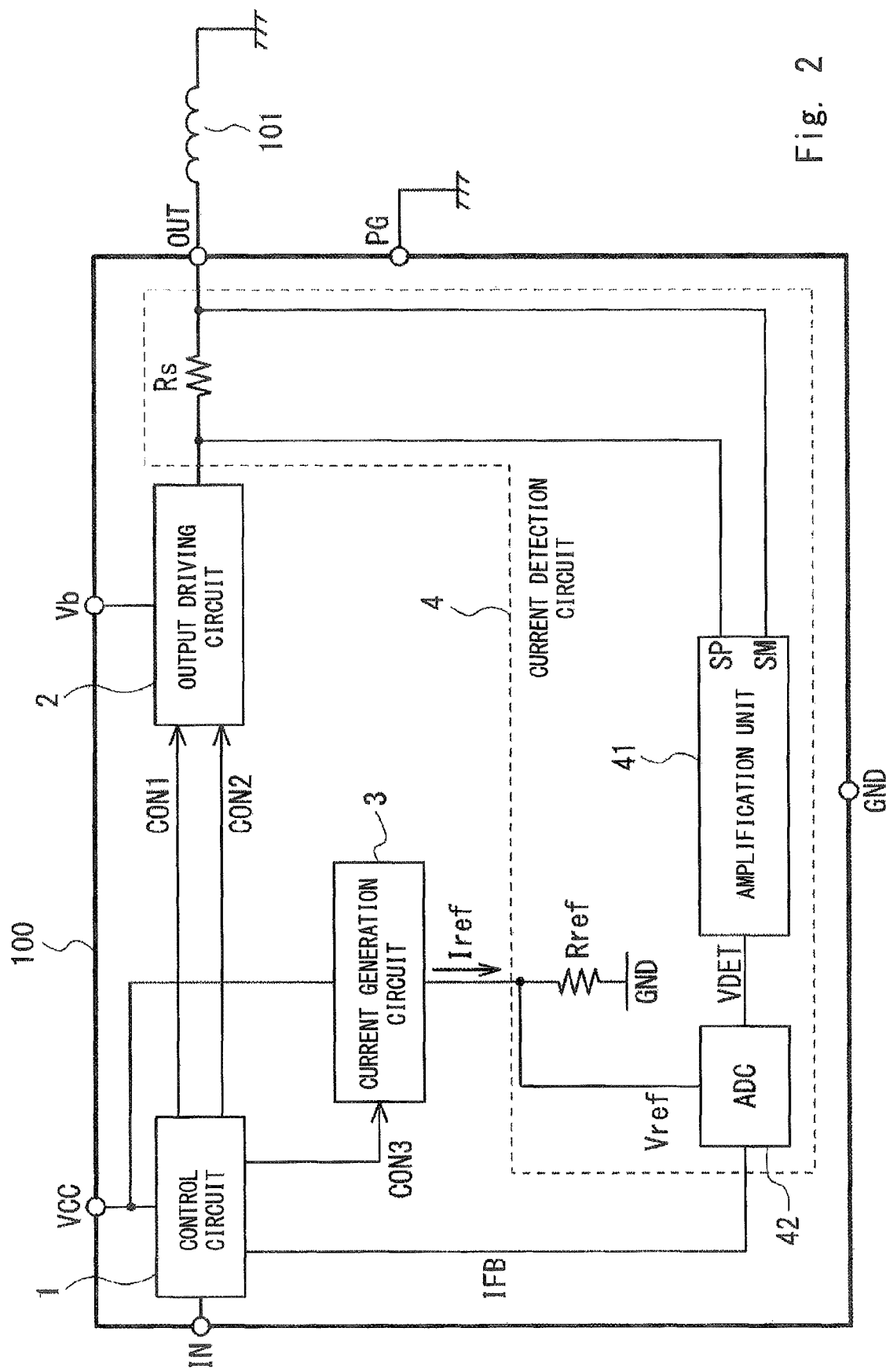
FIG. 2 is a block diagram schematically illustrating a configuration of the semiconductor device according to the first embodiment.

Hereinafter, the semiconductor device 100 will be described. FIG. 2 is a block diagram schematically illustrating a configuration of the semiconductor device 100 according to the first embodiment. The semiconductor device 100 includes a control circuit 1, an output driving circuit 2, a current generation circuit 3 and a current detection circuit 4.

The control circuit 1 is supplied with power from a device-side power supply VCC (also as referred to as a first power supply). The control circuit 1 controls the output driving circuit 2 using control signals CON1 and CON2, and the current generation circuit 3 using a control signal CON3 according to a digital detection signal IFB that is a detection result of the current detection circuit 4. Specifically, the control circuit 1 is configured to enable to control a value of an output current Iout output from the output driving circuit 2 and a value of a reference current Iref output from the current generation circuit 3 according to the digital detection signal IFB.

Figure 3:
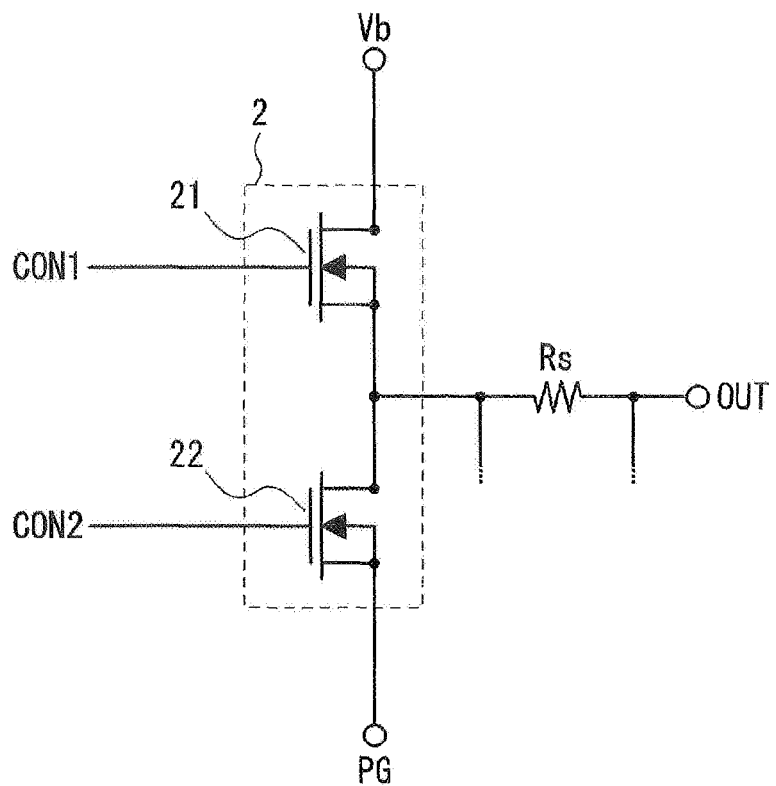
FIG. 3 is a circuit diagram schematically illustrating a substantial part of a configuration of the output driving circuit of the semiconductor device according to the first embodiment.

FIG. 3 is a circuit diagram schematically illustrating a substantial part of a configuration of the output driving circuit 2 of the semiconductor device 100. The output driving circuit 2 outputs the output current Iout to a solenoid 101 of a solenoid valve mounted on a vehicle through an output terminal OUT. In this example, the solenoid 101 is connected between the output terminal OUT and a power-train ground.

The output driving circuit 2 includes a high-side driver (HSD) 21, a low-side driver (LSD) 22 and a detection resistor Rs. In this example, each of the high-side driver (HSD) 21 and the low-side driver (LSD) 22 is composed of an NMOS (N-channel Metal-Oxide-Semiconductor) transistor. The drain of the NOMS transistor constituting the HSD 21 is connected to a power-train power supply Vb (also as referred to as a second power supply). The source of the NOMS transistor constituting the HSD 21 is connected to the drain of the NOMS transistor constituting the LSD 22. The source of the NOMS transistor constituting the LSD 22 is connected to a power-train ground terminal PG connecting to the power-train ground. The control signal CON1 from the control circuit 1 is input to the gate of the NOMS transistor constituting the HSD 21. The control signal CON2 from the control circuit 1 is input to the gate of the NOMS transistor constituting the LSD 22.

Figure 4:
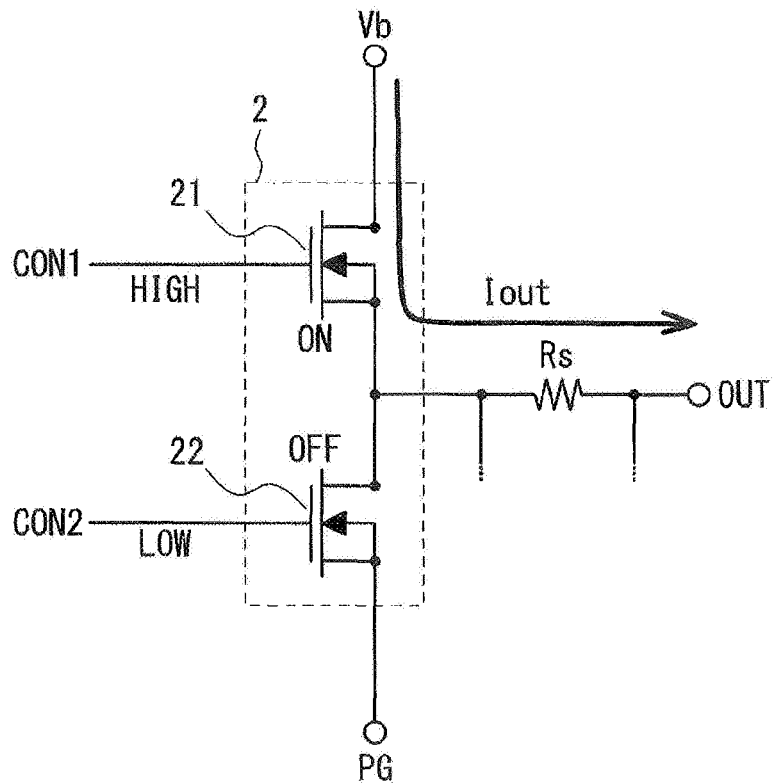
FIG. 4 is a circuit diagram illustrating a current flow in the output driving circuit of the semiconductor device according to the first embodiment when a HSD (high-side driver) is turned on and a LSD (low-side driver) is turned off.
Figure 5:
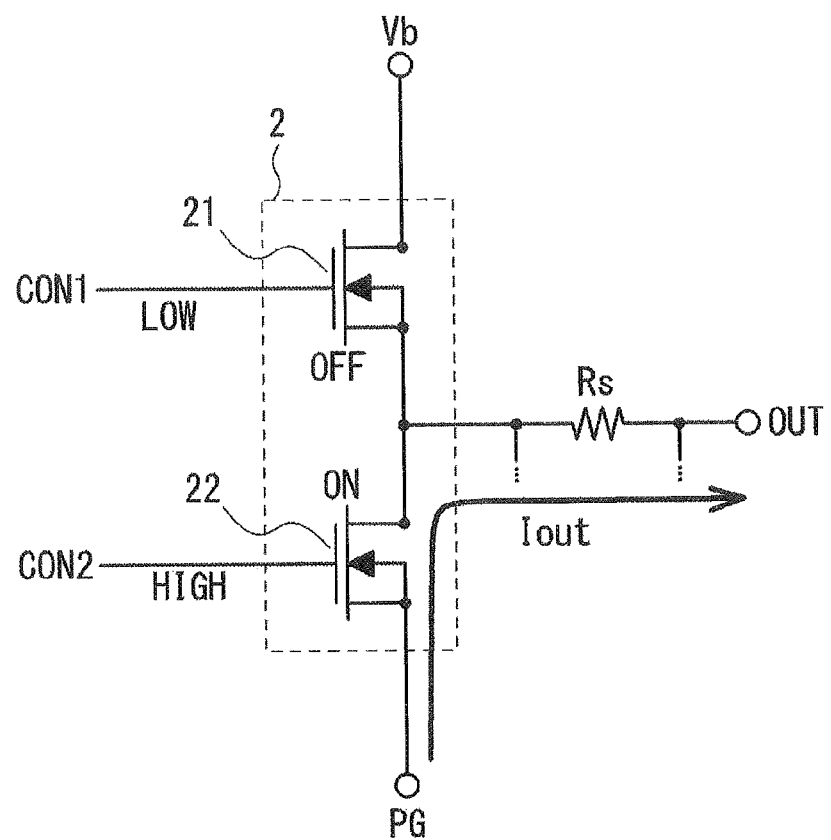

The HSD21 and LSD22 are controlled to complementarily open/close (turn ON/turn OFF) by a PWM (Pulse Width Modulation) control by the control circuit 1. FIG. 4 is a circuit diagram illustrating a current flow in the output driving circuit 2 of the semiconductor device 100 according to the first embodiment when the HSD 21 is turned on and the LSD 22 is turned off. When the HSD 21 is turned on and the LSD is turned off, a current is output from the power-train power supply Vb in a direction of flowing into the solenoid 101 with increase in a value of the current. FIG. 5 is a circuit diagram illustrating a current flow in the output driving circuit 2 of the semiconductor device 100 according to the first embodiment when the HSD 21 is turned off and the LSD 22 is turned on. When the HSD 21 is turned off and the LSD is turned on, a current is output from the power-train ground through the power-train ground terminal PG in a direction of flowing into the solenoid 101 with decrease in a value of the current.

Figure 6:
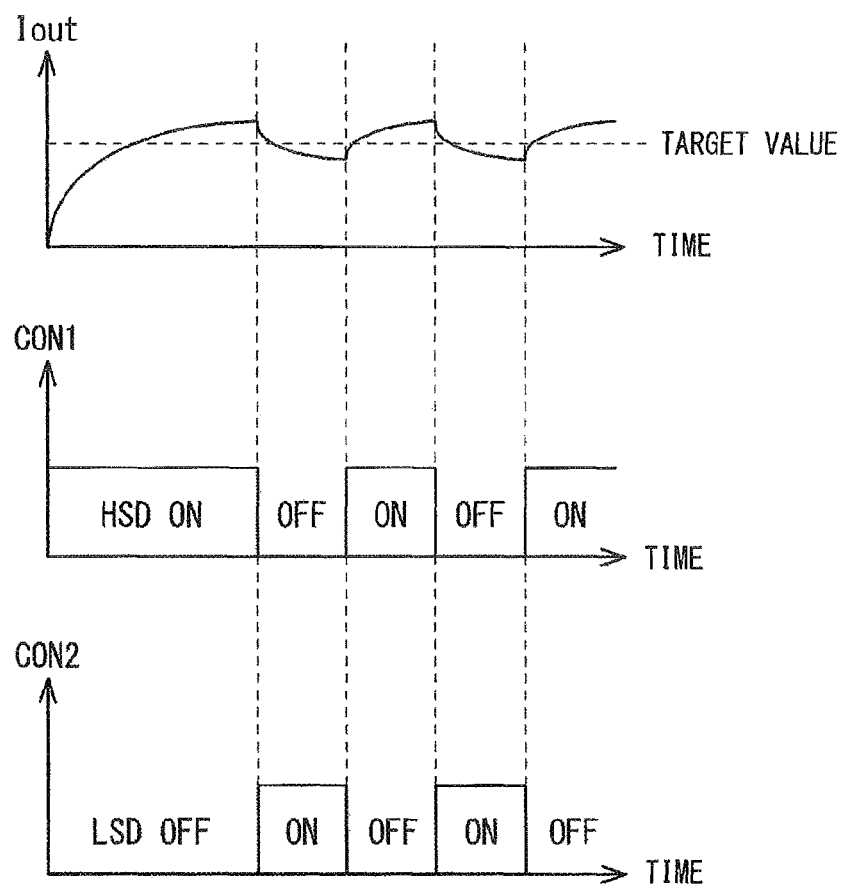
FIG. 6 is a graph illustrating an output current and control signals of the semiconductor device according to the first embodiment.

FIG. 6 is a graph illustrating the output current and the control signals of the semiconductor device 100 according to the first embodiment. As described below, the control circuit 1 monitors the output current Iout of the output driving circuit 2 by monitoring voltages of both ends of the detection resistor Rs. Then, the control circuit 1 performs a PWM control on the HSD 21 and LSD 22 according to a monitoring result, so that the HSD 21 and LSD 22 are complementarily turned on/turned off and the output current Iout is controlled to converge to a target value.

The current generation circuit 3 is supplied with the power from the device-side power supply VCC. The current generation circuit 3 outputs the reference current Iref the value of which corresponds to the control by the control circuit 1, to the current detection circuit 4. In the present embodiment, the reference current Iref is a constant value regardless of temperature.

The current detection circuit 4 detects the output current Iout of the output driving circuit 2 and output the detection result to the control circuit 1. The current detection circuit 4 includes an amplification unit 41, an A/D converter 42, the detection resistor Rs and a reference resistor Rref. One end of the detection resistor Rs is connected to the drain of the NMOS transistor constituting the HSD 21 and the source of the NMOS transistor constituting the LSD 22. The other end of the detection resistor Rs is connected to the output terminal OUT of the semiconductor device 100. A terminal SP of the amplification unit 41 is connected to a high-voltage-side end (i.e., an end of a side of the HSD 21 and LSD 22) of the detection resistor Rs. A terminal SM of the amplification unit 41 is connected to a low-voltage-side end (i.e., an end of a side of the output terminal) of the detection resistor Rs. Accordingly, the amplification unit 41 outputs an analog detection signal VDET that is generated by amplifying a voltage between both ends of the detection resistor Rs.

The reference resistor Rref is connected between the current generation circuit 3 and a device-side ground GND. The reference current Iref from the current generation circuit 3 flows through the reference resistor Rref, so that a reference voltage Vref appears at a high-voltage-side end of the reference resistor Rref. The A/D converter 42 performs A/D conversion on the analog detection signal VDET referring to the reference voltage Vref as a reference. The A/D converted digital detection signal IFB is output to the control circuit 1.

Figure 7:
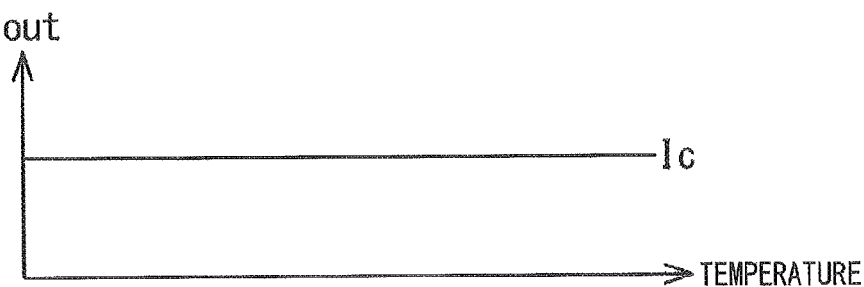
FIG. 7 is a graph illustrating temperature characteristics of an amplification unit of the semiconductor device according to the first embodiment.
Figure 7:
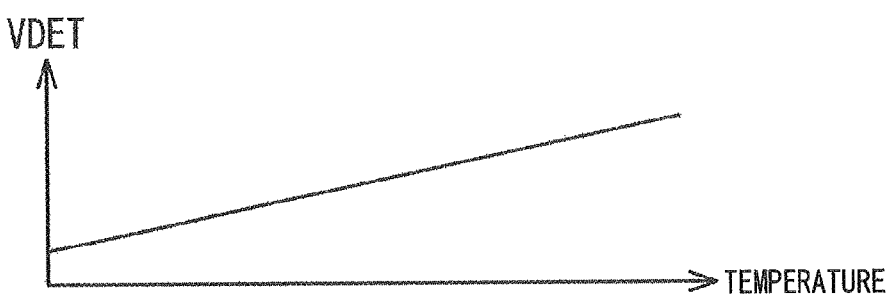

Next, an operation of the semiconductor device 100 will be described. FIG. 7 is a graph illustrating temperature characteristics of the amplification unit 41 of the semiconductor device 100 according to the first embodiment. As illustrated in FIG. 7, in the case of increasing in the temperature, a resistance value of the detection resistor Rs with respect to an output current of the same value (Ic in FIG. 7) increases. Therefore, the analog detection signal VDET output from the amplification unit 41 also increases. That is, the amplification unit 41 has positive temperature characteristics.

Figure 8:
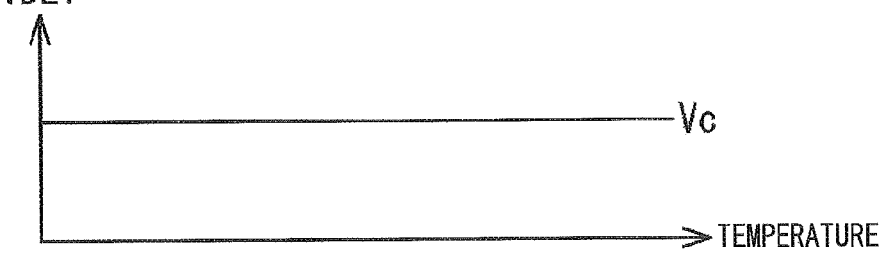
FIG. 8 is a graph illustrating temperature characteristics of an A/D converter of the semiconductor device according to the first embodiment.
Figure 8:
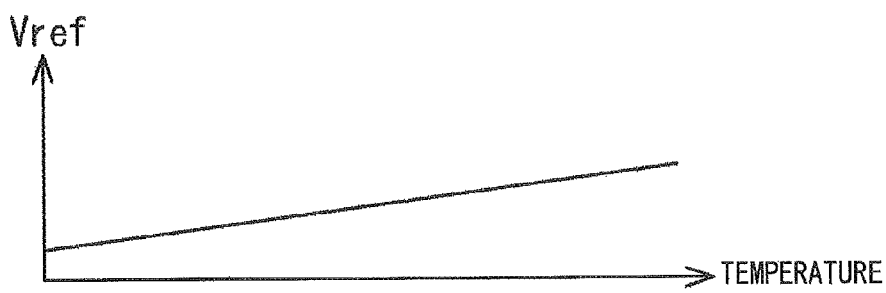
Figure 8:
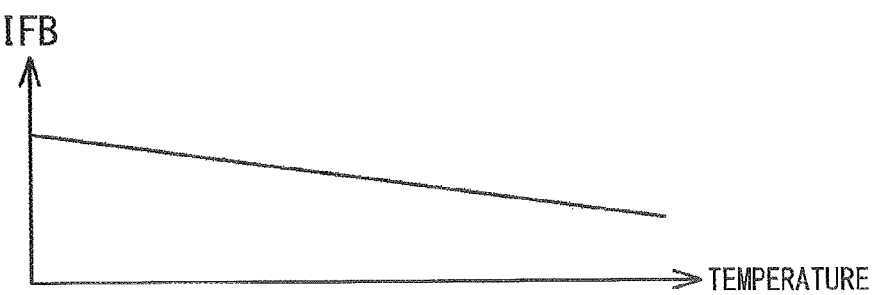

FIG. 8 is a graph illustrating temperature characteristics of the A/D converter 42 of the semiconductor device 100 according to the first embodiment. As illustrated in FIG. 8, in the case of increasing in the temperature, a resistance value of the reference resistor Rref (Ic in FIG. 7) increases, so that the reference voltage Vref also increases. As described above, the A/D converter 42 performs the A/D conversion referring to the reference voltage Vref as a reference. Therefore, in this case, the digital detection signal IFB with respect to the analog detection signal VDET of the same value (Vc in FIG. 8) decreases. That is, the A/D converter 42 has negative temperature characteristics.

Figure 9:
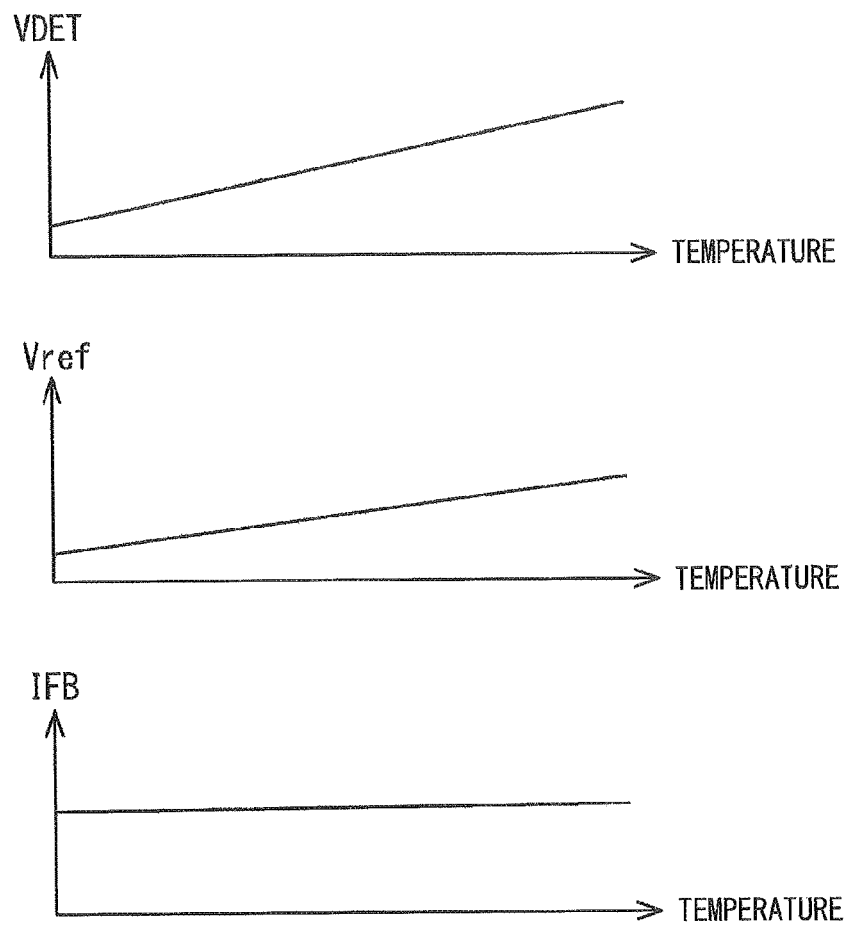
FIG. 9 is a graph illustrating an example of temperature characteristics of a digital detection signal of the semiconductor device according to the first embodiment.

FIG. 9 is a graph illustrating an example of temperature characteristics of the digital detection signal IFB of the semiconductor device 100 according to the first embodiment. As described above, since the amplification unit 41 and the A/D converter 42 have the temperature characteristics opposed to each other (signs thereof are different from each other), the temperature characteristics thereof are canceled. As a result, the temperature characteristics appearing in the digital detection signal IFB can be alleviated or eliminated.

As described above, according to the preset configuration, variation of the output current in the case that the temperature varies can be prevented by suppressing the temperature characteristics of the digital detection signal IFB. As a result, it is possible to prevent variation of controllability of a vehicle such as increasing in shock of the shift-change in a vehicle or deterioration of the ride quality associated with the temperature variation.

In the present configuration, it is desirable that the detection resistor Rs and the reference resistor Rref are the same type resisters to precisely alleviate or eliminate the temperature variation appearing in the digital detection signal IFB. Thus, since it is possible to approximate an absolute value of a variation rate (a gradient) of the temperature characteristics of the amplification unit 41 and an absolute value of a variation rate (a gradient) of the temperature characteristics of the A/D converter 42, it is possible to expect to precisely cancel both characteristics in a wide temperature range.

Figure 10:
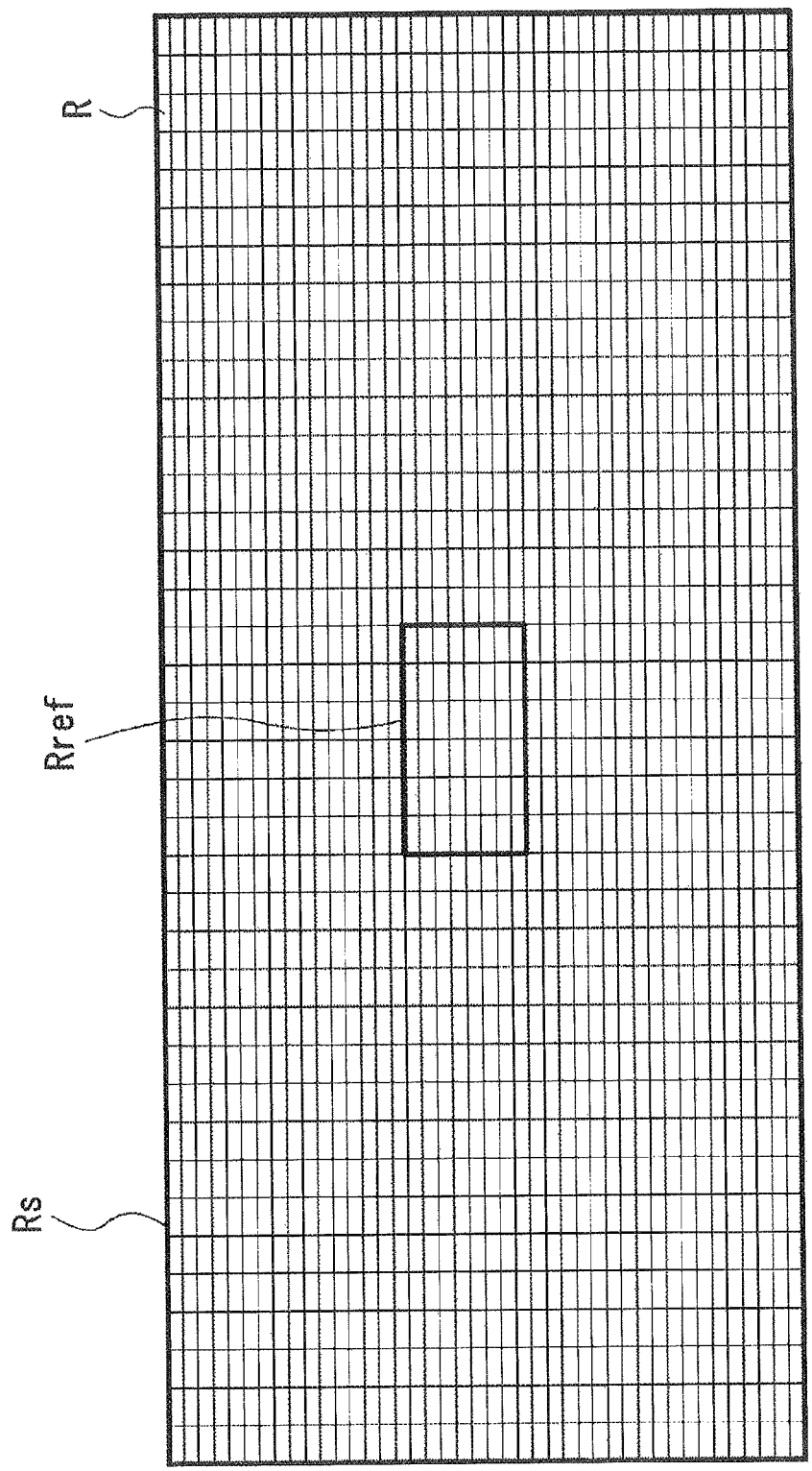
FIG. 10 is a plane view schematically illustrating an example of a layout of detection resistors and reference resistors.

Further, it is desirable that the detection resistor Rs and the reference resistor Rref is disposed in the semiconductor device 100 as approximately as possible, or preferably disposed next to each other. Thus, since the same temperature variation can be applied to the detection resistor Rs and the reference resistor Rref, it is possible to expect to precisely cancel both of characteristics in a wide temperature range. FIG. 10 is a plane view schematically illustrating an example of a layout of the detection resistors Rs and the reference resistors Rref. Each small square in FIG. 10 represents a resistor element R. Each of the detection resistor Rs and the reference resistor Rref is configured by connecting a plurality of the resistors R in parallel. The resistor R is formed as a poly-silicon resistor formed on a semiconductor substrate, for example. In this example, the detection resistor Rs is configured as a wide-area and low-resistance resistor to cause a decrease in a value of the output current Iout flowing through the detection resistor Rs to be as small as possible. Therefore, number of the resistor elements R constituting the detection resistor Rs is larger than number of the resistor elements R constituting the reference resistor Rref. Accordingly, as illustrated in FIG. 10, it is possible to average the temperature variations applied to the detection resistor Rs and the reference resistor Rrefe, for example, by disposing the reference resistor Rref to be surrounded by the detection resistors Rs. Accordingly, it is possible to precisely cancel the temperature characteristics of the amplification unit 41 and the A/D converter 42 in a wide temperature range.

Note that the layout of the detection resistors Rs and the reference resistors Rref illustrated in FIG. 10 is merely an exemplary. For example, the resistor elements R constituting the reference resistor Rref can be divided into a plurality of groups and dispersedly dispose the plurality of groups in a matrix of the resistor elements R.

Second Embodiment

Figure 11:
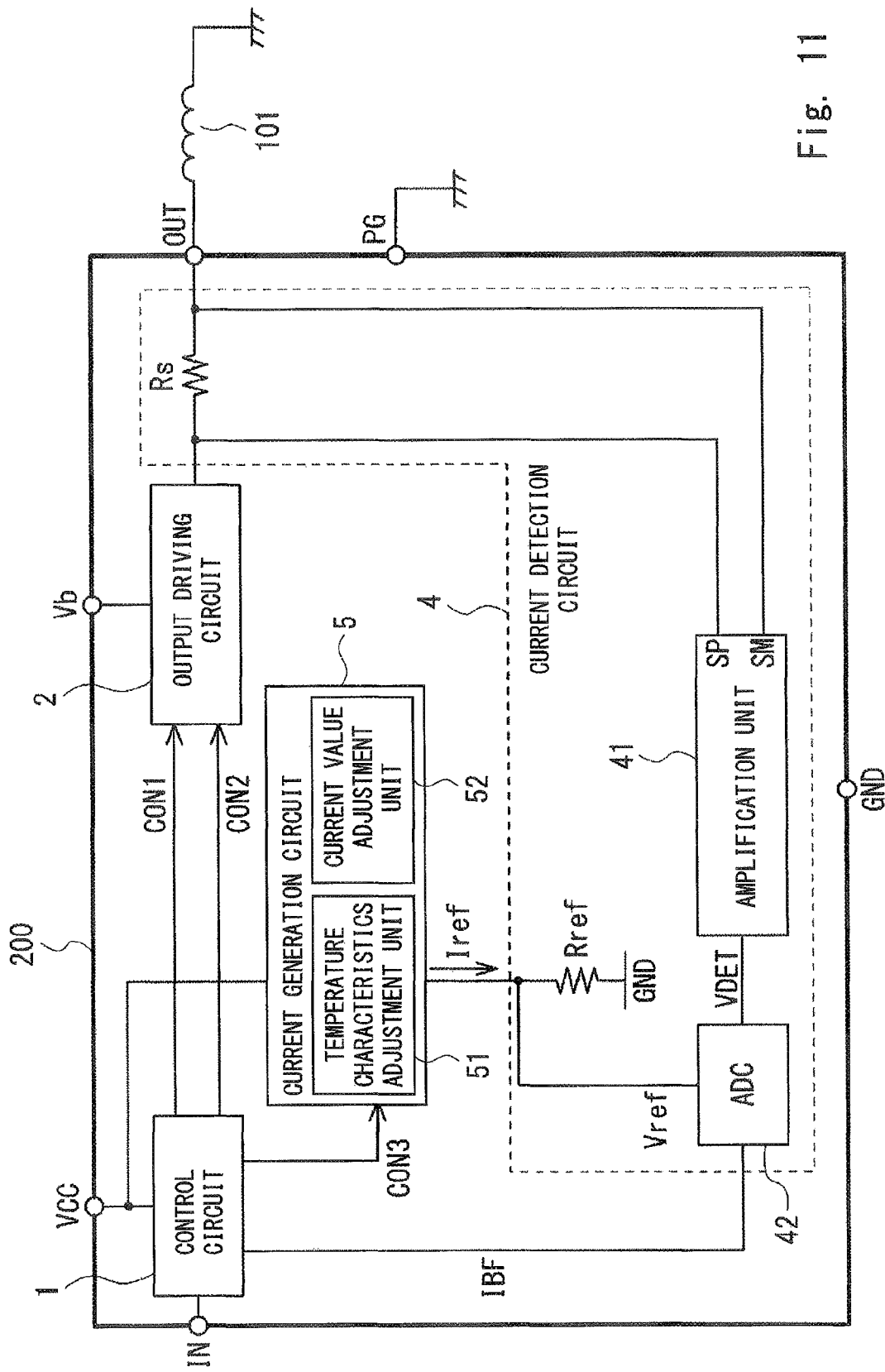
FIG. 11 is a block diagram schematically illustrating a configuration of a semiconductor device 200 according to a second embodiment.

A semiconductor device 200 according to a second embodiment will be described. FIG. 11 is a block diagram schematically illustrating a configuration of the semiconductor device 200 according to the second embodiment. The semiconductor device 200 has a configuration in which the current generation circuit 3 of the semiconductor device 100 is replaced with a current generation circuit 5.

The current generation circuit 5 includes a temperature characteristics adjustment unit 51 and a current value adjustment unit 52. The temperature characteristics adjustment unit 51 provides the reference current Iref with the temperature characteristics according to the control signal CON3 from the control circuit 1. The current value adjustment unit 52 adjusts a value of the reference current Iref after the temperature characteristics thereof is adjusted by the temperature characteristics adjustment unit 51. Since other configuration of the semiconductor device 200 is the same as that of the semiconductor device 100, a description thereof will be omitted.

As described in the first embodiment, although the temperature characteristics of the amplification unit 41 and the A/D converter 42 are canceled with each other, the temperature characteristics may remain in the digital detection signal IFB when the variation rates (the gradients) of the temperature characteristics of the amplification unit 41 and the A/D converter 42 are different from each other. The semiconductor device 200 can precisely cancel the temperature characteristics of the amplification unit 41 and the A/D converter 42 and eliminate the temperature characteristics of the digital detection signal IFB by providing the reference current Iref with the temperature characteristics.

Figure 12:
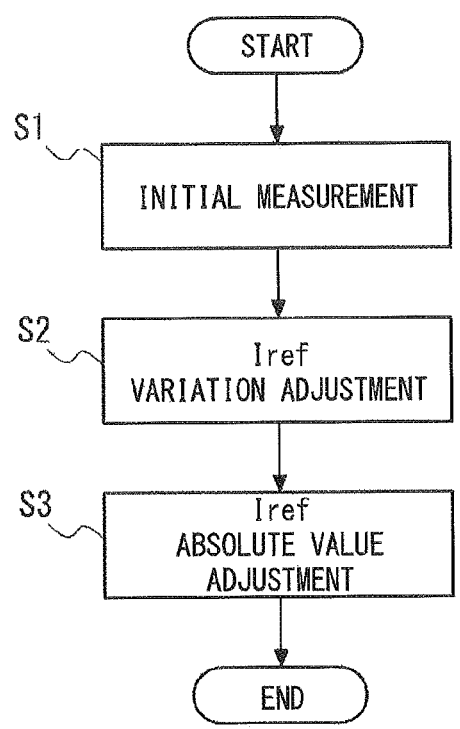
FIG. 12 is a flow chart illustrating procedure of correcting temperature characteristics in the semiconductor device according to the second embodiment.

Hereinafter, an operation of the semiconductor device 200 will be described. FIG. 12 is a flow chart illustrating procedure of correcting the temperature characteristics in the semiconductor device 200 according to the second embodiment. For example, the correction of the temperature characteristics is performed as an initial setting before the semiconductor device 200 is incorporated in a system (e.g., a pre-shipment tuning).

Step S1: Initial Setting

Figure 13:
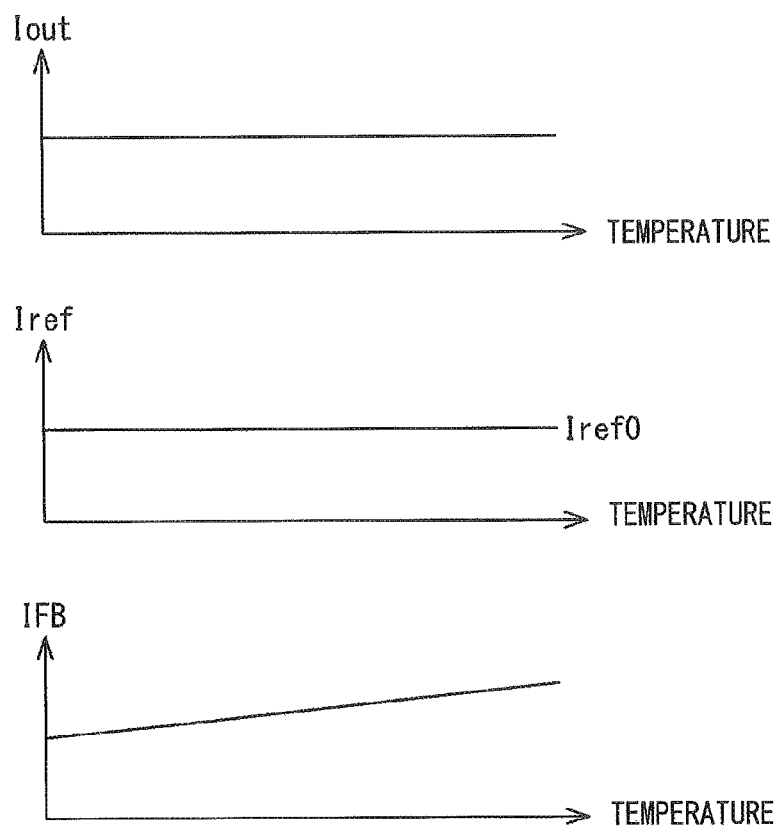
FIG. 13 is a diagram illustrating temperature characteristics of a digital detection signal in an initial measurement according to the second embodiment.

First, in an initial setting, as a preparation for providing the reference current Iref with the temperature characteristics, the temperature characteristics of the digital detection signal IFB of the A/D converter 42 is measured in an environment in which the temperature varies in a state where the output current Iout is holding at a constant value. In this case, the current generation circuit 5 controls the reference current Iref to maintain the value thereof being constant (Iref0 in FIG. 13). Thus, the temperature characteristics remaining in the digital detection signal IFB can be obtained. FIG. 13 is a diagram illustrating the temperature characteristics of the digital detection signal IFB in an initial measurement according to the second embodiment. In this example, as illustrated in FIG. 13, the temperature characteristics of the digital detection signal IFB have positive temperature characteristics.

Step S2: Adjustment of Variation of Temperature Characteristics

Figure 14:
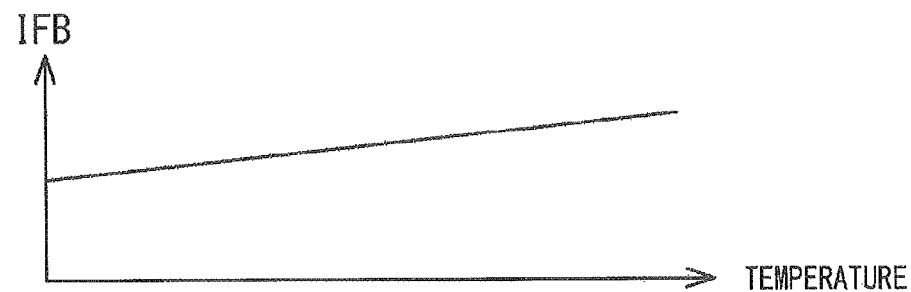
FIG. 14 is a graph illustrating an adjustment of variation of the temperature characteristics in steps S2 and S3.
Figure 14:
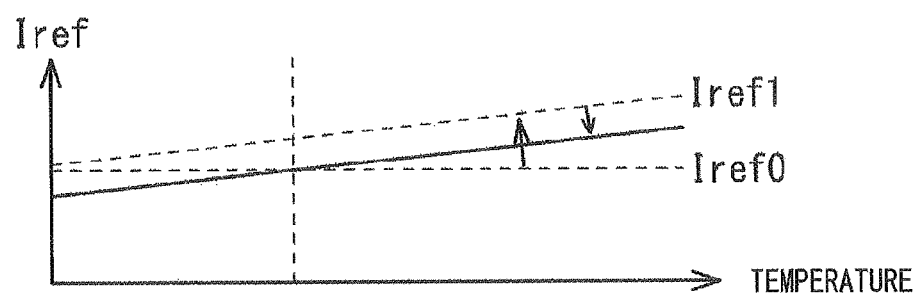

Next, the temperature characteristics adjustment unit 51 of the current generation circuit 5 corrects the temperature characteristics of the reference current Iref so that the reference current Iref has the same temperature characteristics as the digital detection signal IFB. FIG. 14 is a graph illustrating an adjustment of variation of the temperature characteristics in the steps S2 and S3. Specifically, the adjustment is performed to cause a variation (a gradient) of temperature of the reference current Iref is the same as a variation (a gradient) of temperature of the digital detection signal IFB (Iref in FIG. 14).

Step S3: Adjustment of Absolute Value of Temperature Characteristics

Next, the current value adjustment unit 52 of the current generation circuit 5 corrects an absolute value of the temperature characteristics of the reference current Iref. A position of a line (or a curved line) representing the temperature characteristics of the reference current Iref is shifted due to the correction of the temperature characteristics described above. Thus, the temperature characteristics of the reference current Iref is corrected by shifting up or down to cause the absolute value of the temperature characteristics of the reference current Iref at reference temperature to be a predetermined value.

Accordingly, the temperature characteristics remaining in the digital detection signal IFB can be eliminate, so that the variation of the value of the digital detection signal IFB due to the temperature can be prevented.

Figure 15:
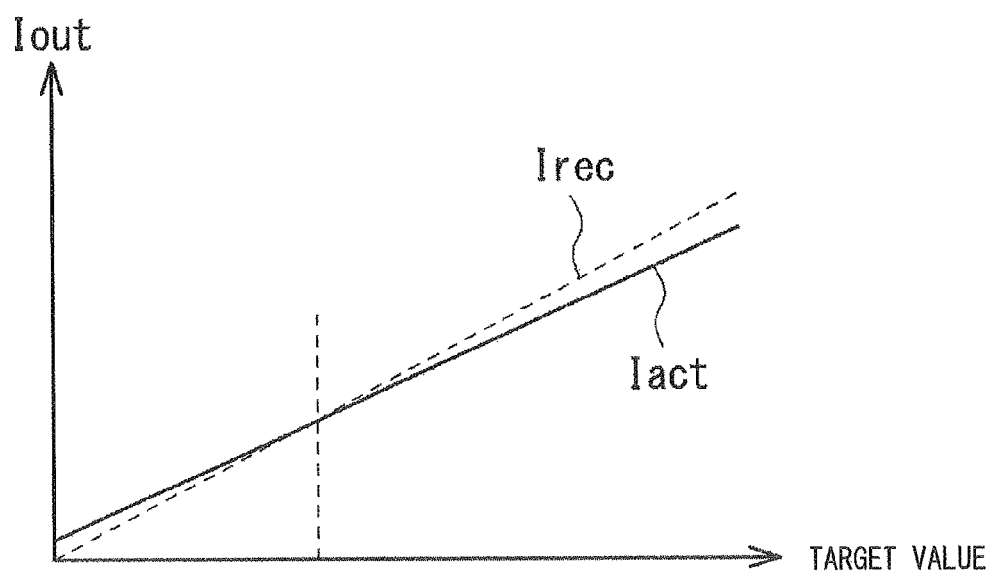
FIG. 15 is a graph illustrating an example of difference between an output current value recognized by a control circuit of the semiconductor device according to the second embodiment and an actual output current value.

Note that a difference between an output current value recognized by the control circuit 1 based on the digital detection signal IFB and an actual output current value is caused when the digital detection signal IFB is compensated. FIG. 15 is a graph illustrating an example of the difference between the output current value Irec recognized by the control circuit 1 of the semiconductor device 200 according to the second embodiment and the actual output current value Iact. As illustrated in the FIG. 15, the output current value Irec recognized by the control circuit 1 is not coincide with the actual output current value Iact. Note that the actual output current value Iact described here represents an output current value actually measured, for example, by a measurement device outside the semiconductor device 200.

The control circuit 1 adjusts a variation of the output current value Irec recognized by the control circuit 1 to coincide with a variation of the actual output current value Iact based on the difference between the output current value Irec recognized by the control circuit 1 and the actual output current value Iact. Specifically, the control circuit 1 receives a measurement result of the actual output current value Iact from an external measurement device or the like, and calculates the variation of the actual output current value Iact based on the measurement result. Then, the control circuit 1 calculates a coefficient, by which the output current value Irec recognized by the control circuit 1 is multiplied, to cause the variation of the output current value Irec recognized by the control circuit 1 to coincide with the variation of the actual output current value Iact. Thus, the variation of the output current value Irec recognized by the control circuit 1 coincide with the variation of the actual output current value Iact by multiplying the output current value Irec recognized by the control circuit 1 by the calculated coefficient (a gain adjustment). After that, the absolute value of the output current value Irec recognized by the control circuit 1 is adjusted to cause the output current value Irec recognized by the control circuit 1 to coincide with the actual output current value Iact (an offset adjustment).

According to the procedure described above, in the semiconductor device 200, the difference between the output current value Irec recognized by the control circuit 1 and the actual output current value Iact is canceled. Therefore, the semiconductor device 200 can output the output current having the designated value.

Third Embodiment

Figure 16:
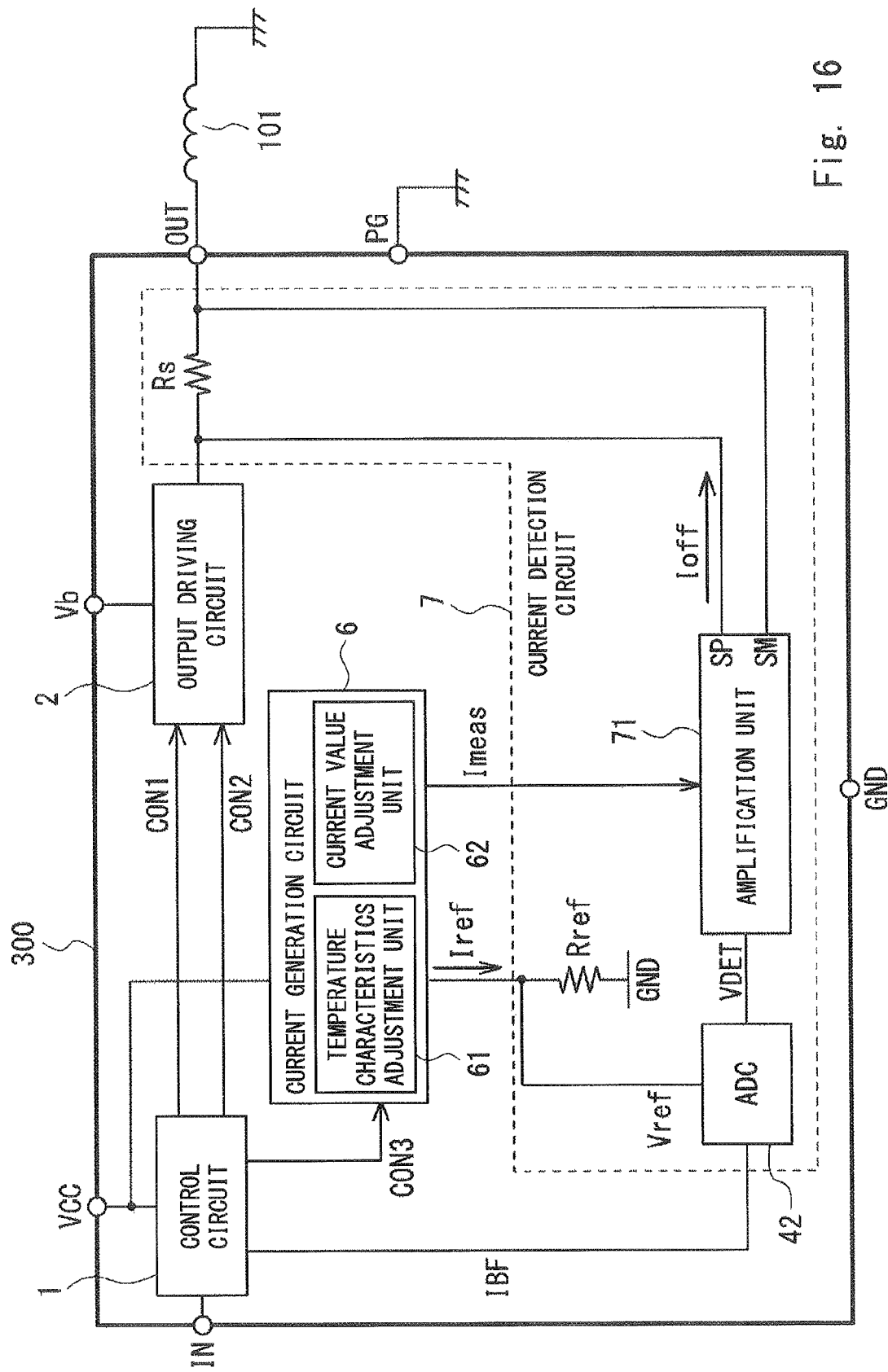
FIG. 16 is a block diagram schematically illustrating a configuration of a semiconductor device according to a third embodiment.

A semiconductor device 300 according to a third embodiment will be described. FIG. 16 is a block diagram schematically illustrating a configuration of the semiconductor device 300 according to the third embodiment. The semiconductor device 300 has a configuration in which the current generation circuit 3 and the current detection circuit 4 are replaced with a current generation circuit 6 and a current detection circuit 7, respectively.

The current generation circuit 6 outputs not only the reference current Iref but also a current Imeas (referred to as a first current) to the current detection circuit 7. Note that the current generation circuit 6 includes a temperature characteristics adjustment unit 61 and a current value adjustment unit 62. The temperature characteristics adjustment unit 61 and the current value adjustment unit 62 correspond to the temperature characteristics adjustment unit 51 and the current value adjustment unit 52 of the current generation circuit 5, respectively. In the current generation circuit 6, the temperature characteristics adjustment unit 61 is configured to be capable of controlling variations of the temperature characteristics of the reference current Iref and the current Imeas. The current value adjustment unit 62 is configured to be capable of controlling absolute values of the reference current Iref and the current Imeas after the variation adjustment of the temperature characteristics.

Figure 17:
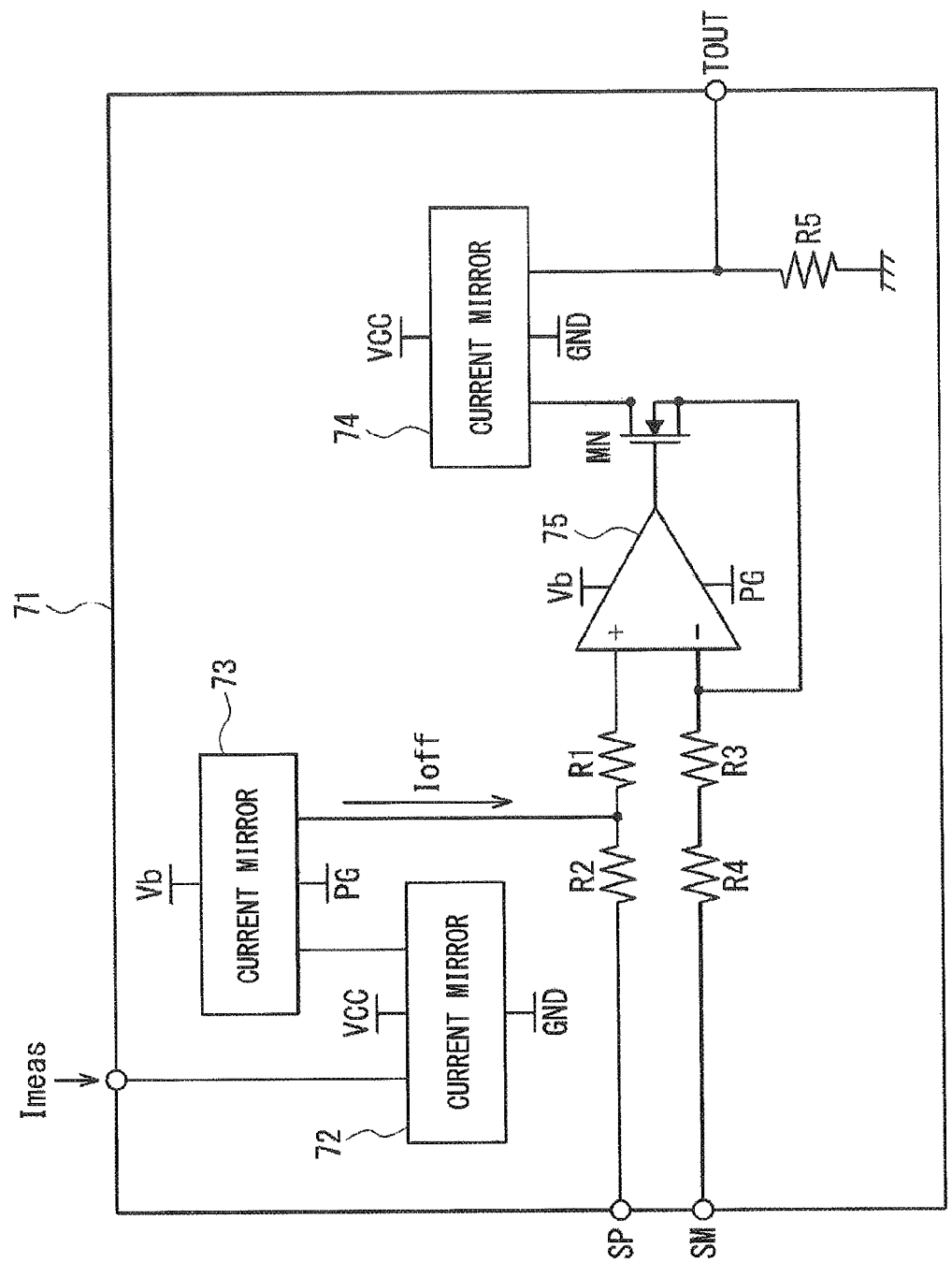
FIG. 17 is a circuit diagram schematically illustrating a configuration of an amplification unit of the semiconductor device according to the third embodiment.

FIG. 17 is a circuit diagram schematically illustrating a configuration of an amplification unit 71 of the semiconductor device 300 according to the third embodiment. The current detection circuit 7 has a configuration in which an amplification unit 41 of the current detection circuit 4 is replaced with the amplification unit 71. The amplification unit 71 includes current mirrors 72 to 74, an operation amplifier 75, a NMOS transistor NM and resistors R1 to R5. Hereinafter, the resistor R5 is also referred to as a second resistor. The resistor R1 is also as referred to as a second resistor. The current mirror 74 is also referred to as a first current mirror. The current mirror 72 is also referred to as a second current mirror. The current mirror 73 is also referred to as a third current mirror.

An output terminal of the operation amplifier 75 is connected to the gate (the control terminal) of the NMOS transistor NM. The drain of the NMOS transistor NM is connected to the current mirror 74. The current mirror 74 is connected to the output terminal TOUT and connected to the device-side ground GND through the resistor R5. The current mirror 74 is supplied with the power from the power supply VCC, duplicates a current flowing through the NMOS transistor NM and outputs the duplicated current to the resistor R5. Thus, a voltage of the high-voltage-side end of the resistor R5 is output as the analog detection signal VDET from the output terminal TOUT.

The non-inverting input terminal of the operation amplifier 75 (also referred to as a first input) is connected to the resistor R1. The resistor R2 is connected to between the resistor R1 and the terminal SP. The inverting input terminal of the operation amplifier 75 (also referred to as a second input) is connected to the resistor R3 and the source of the NMOS transistor NM.

The current mirror 72 is supplied with the power from the power supply VCC and duplicates the current Imeas output from the current generation circuit 6. The current mirror 73 is supplied with the power from the drive-train-side power supply Vb and further duplicates the duplicated current Imeas. The current mirror 73 outputs the supplicated current to the terminal SP through the resistor R2 as a current Ioff.

Ion the amplification unit 71, since the current Ioff flows through the resistor R2, an offset voltage Voff is generated. Thus, an input offset of the operation amplifier 75 is compensated. Since the resistor R2 has positive temperature characteristics similarly to the detection resistor Rs and the reference resistor Rref, the offset voltage Voff increases as the temperature varies. Therefore, the value of the analog detection signal VDET output from the amplification unit 71 varies when the current detection circuit 7 is not output. Thus, in the present embodiment, the value of the offset voltage Voff is stabilized by providing the current Ioff with temperature characteristics.

Specifically, the temperature characteristics adjustment unit 61 provides the current Imeas with negative temperature characteristics and then the current value adjustment unit 62 adjusts the absolute value of the current Imeas, so that the current Imeas is provided with predetermined negative temperature characteristics. Thus, the current Ioff generated by duplicating the current Imeas also has the predetermined negative temperature characteristics.

That is, the value of Ioff decreases while the resistance value of the resistor R2 increase with increasing in the temperature. Therefore, according to the present configuration, the temperature characteristics of the offset voltage Voff provided to the operation amplifier 75 can be guaranteed and the value can be kept constant. Thus, the value of the analog detection signal VDET output from the amplification unit 71 is prevented from varying when the current detection circuit 7 is not output.

Fourth Embodiment

Figure 18:
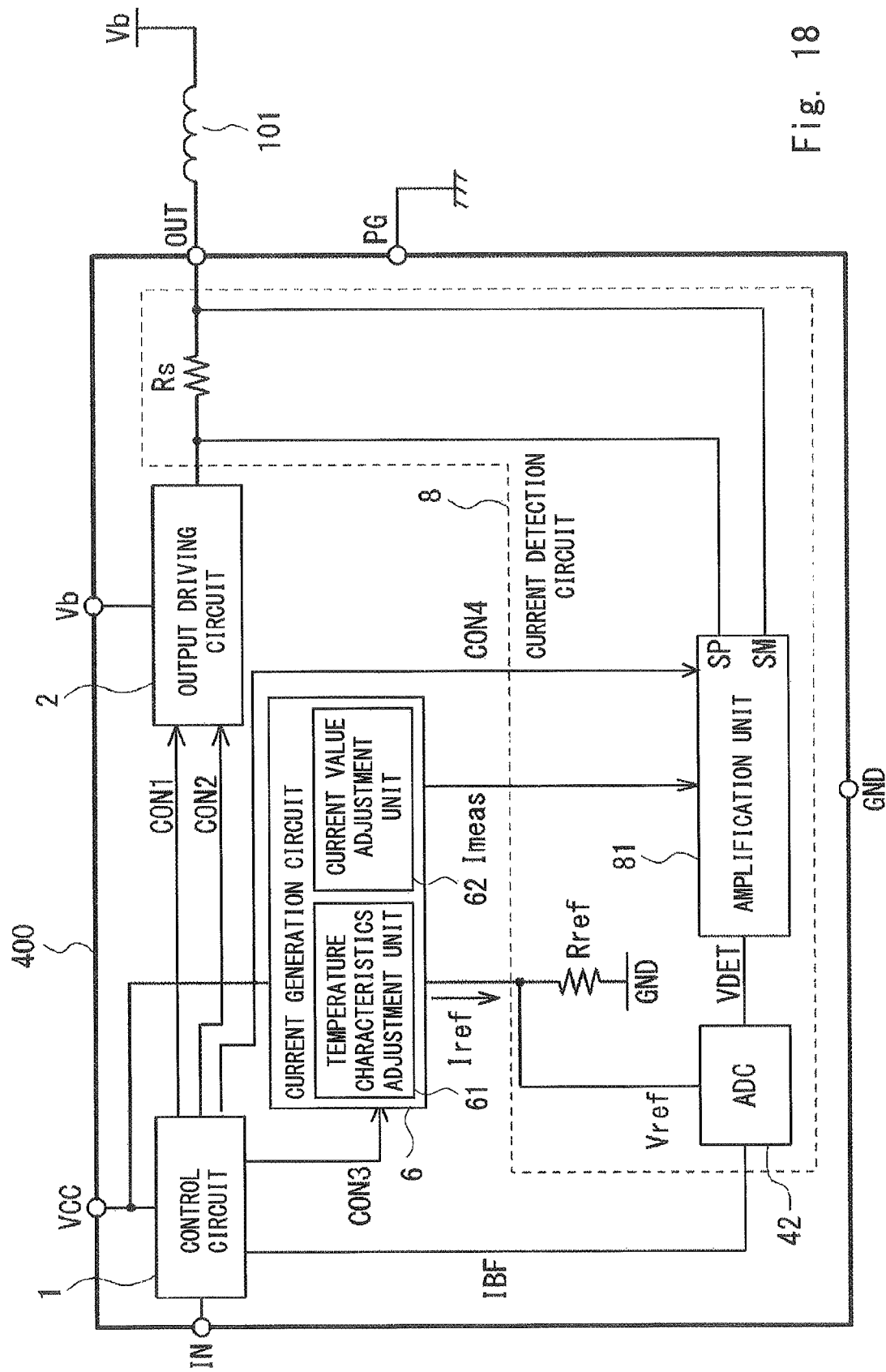
FIG. 18 is a block diagram schematically illustrating a configuration of a semiconductor device according to a fourth embodiment.

A semiconductor device 400 according to a fourth embodiment will be described. The semiconductor device 400 is an alternative of the semiconductor device 300 according to the third embodiment. FIG. 18 is a block diagram schematically illustrating a configuration of the semiconductor device 400 according to the fourth embodiment. The semiconductor device 400 has a configuration in which the current detection circuit 7 is replaced with a current detection circuit 8. The output terminal OUT is connected to the drive-train power supply Vb through the solenoid 101.

Figure 19:
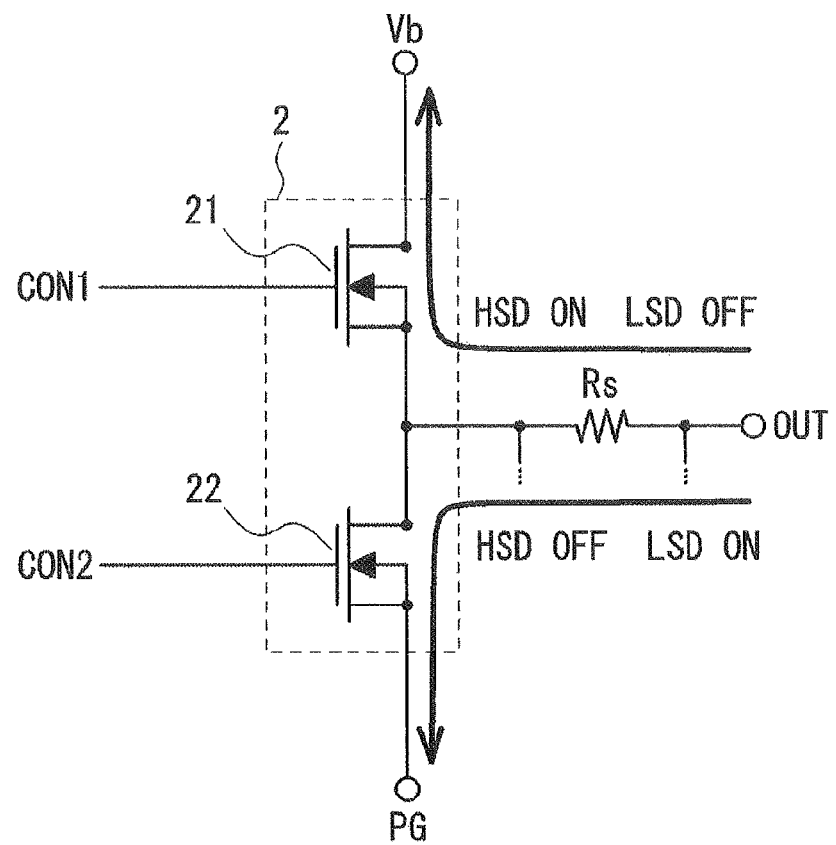
FIG. 19 is a circuit diagram schematically illustrating a substantial part of a configuration of an output driving circuit of the semiconductor device according to the fourth embodiment.

FIG. 19 is a circuit diagram schematically illustrating a substantial part of a configuration of the output driving circuit 2 of the semiconductor device 400 according to the fourth embodiment. In the present embodiment, since the output terminal OUT is connected to the drive-train power supply Vb through the solenoid 101, a direction of the output current is inverted with respect to that of the first to third embodiments. When the HSD 21 is turned off and the LSD 22 is turned on, the output current flows into the power-train power supply from the external power-train power supply Vb through the output terminal OUT and the power-train ground terminal PG with increase in a value of the current.

Figure 20:
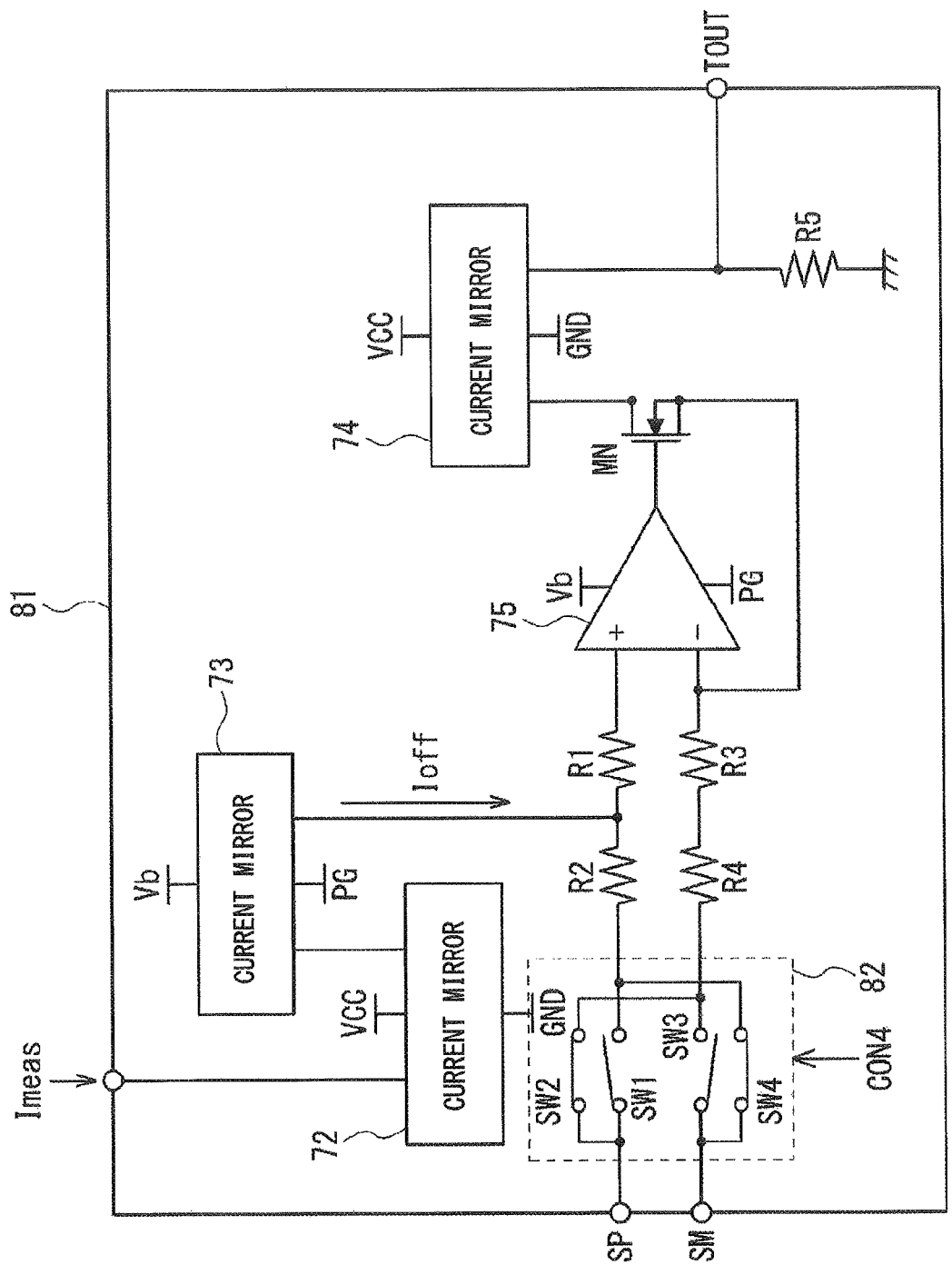
FIG. 20 is a circuit diagram schematically illustrating a configuration of an amplification unit of the semiconductor device according to the fourth embodiment.

Since the direction of the current is inverted, for example, in the case of using the current detection circuit 7 of the third embodiment, a polarity of the operation amplifier is inverted and the normal amplification operation cannot be performed. Thus, in the present embodiment, the current detection circuit 8 is configured to be capable of performing a normal amplification operation regardless of the direction of the output current Iout. FIG. 20 is a circuit diagram schematically illustrating a configuration of an amplification unit 81 of the semiconductor device 400 according to the fourth embodiment. The current detection circuit 8 has a configuration in which a switch unit 82 is added to the current detection circuit 7 according to the third embodiment.

The switch unit 82 includes switches SW1 to SW4 (These are also referred to as first to fourth switches, respectively.) and the switches are inserted between the terminals SP, SM and the operation amplifier 75. The switch SW1 is inserted between the terminal SP and the resistor R2, or between the terminal SP and the non-inverting terminal of the operation amplifier 75. The switch SW2 is inserted between the terminal SP and the resistor R4, or between the terminal SP and the inverting terminal of the operation amplifier 75. The switch SW3 is inserted between the terminal SM and the resistor R4, or between the terminal SM and the inverting terminal of the operation amplifier 75. The switch SW4 is inserted between the terminal SM and the resistor R2, or between the terminal SM and the non-inverting terminal of the operation amplifier 75.

The switches SW1 and SW3 are configured to complementarily open/close with respect to the switches SW2 and SW4, for example. In the present embodiment, as illustrated in FIG. 20, the switches SW2 and SW4 are closed and the switches SW1 and SW3 are opened. Thus, the high-voltage-side end of the detection resistor Rs is connected to the non-inverting terminal of the operation amplifier 75 and the low-voltage-side end of the detection resistor Rs is connected to the inverting terminal of the operation amplifier 75. As a result, the normal amplification operation can be performed.

On the other hand, when the current detection circuit 8 is applied to the semiconductor devices 100, 200 and 300 described above, the switches SW2 and SW4 are opened and the switches SW1 and SW3 are closed. Thus, the high-voltage-side end of the detection resistor Rs is connected to the inverting terminal of the operation amplifier 75 and the low-voltage-side end of the detection resistor Rs is connected to the non-inverting terminal of the operation amplifier 75. Therefore, the normal amplification operation can be performed.

As described above, according to the present configuration, it is possible to provide the semiconductor device capable of generating the offset voltage compensating the input offset of the operation amplifier regardless of the direction of the output current Iout and keeping the offset voltage constant regardless of the temperature variation.

Other Embodiment

The present invention is not limited to the embodiments described above but can be changed appropriately without departing from the spirit thereof. For example, as in the case of the second embodiment, it should be appreciated that the reference current Iref can be provided with the temperature characteristics in the third embodiment and the fourth embodiment.

As in the case of the fourth embodiment, it should be appreciated that the solenoid 101 is connected between the output terminal OUT and the power-train power supply Vb in the first and second embodiment.

The configuration of the output driving circuit 2 described above is merely an example. Therefore, it should be appreciated that other configurations capable of supplying the solenoid 101 with the output current can be applied.

All or part of the NMOS transistors used in the embodiments described above can be appropriately replaced with PMOS transistors or transistors of other types.

While the present invention made by the present inventors has been described in detail based on the embodiments, the present invention is not limited to the embodiments described above, and various changes can be made without departing from the spirit thereof.

The first to fourth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
    an output driving circuit configured to output an output current to an output terminal;
    a detection resistor connected between the output terminal and the output driving circuit;
    an amplification unit configured to output an analog detection signal generated by amplifying a voltage between both ends of the detection resistor;
    a current generation circuit configured to output a reference current;
    a reference resistor connected between the current generation circuit and a ground and configured to output a reference voltage according to the reference current;
    an A/D converter configured to convert the analog detection signal into a digital detection signal using the reference voltage as a reference; and
    a control circuit configured to control the output current output from the output driving circuit according to the digital detection signal,
    wherein the detection resistor has same temperature characteristics as the reference resistor.

2. The semiconductor device according to claim 1,
    wherein the amplification unit is coupled to the detection resistor through a resistor,
    wherein the current generation circuit outputs a current having negative temperature characteristics to the resistor.

3. The semiconductor device according to claim 1, wherein the current generation circuit is configured to adjust temperature characteristics of the reference current.

* * * * *